US011901002B2

(12) United States Patent
Stellari et al.

(10) Patent No.: US 11,901,002 B2
(45) Date of Patent: Feb. 13, 2024

(54) RRAM FILAMENT SPATIAL LOCALIZATION USING A LASER STIMULATION

(71) Applicant: International Business Machines Corporation, Armonk, NY (US)

(72) Inventors: Franco Stellari, Waldwick, NJ (US); Ernest Y. Wu, Essex Junction, VT (US); Takashi Ando, Eastchester, NY (US); Peilin Song, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 239 days.

(21) Appl. No.: 17/539,295

(22) Filed: Dec. 1, 2021

(65) Prior Publication Data

US 2023/0170019 A1 Jun. 1, 2023

(51) Int. Cl.
*G11C 13/00* (2006.01)
*H10N 70/20* (2023.01)
*H10N 70/00* (2023.01)

(52) U.S. Cl.
CPC ...... *G11C 13/0064* (2013.01); *G11C 13/0007* (2013.01); *H10N 70/24* (2023.02); *H10N 70/826* (2023.02); *H10N 70/8833* (2023.02)

(58) Field of Classification Search
CPC .............................. G11C 13/00; H01N 70/82
USPC ....................................................... 365/148
See application file for complete search history.

(56) References Cited

U.S. PATENT DOCUMENTS

| 7,936,583 | B2 | 5/2011 | Khoury et al. |
| 8,227,896 | B2 * | 7/2012 | Jiang ................... G11C 13/003 365/225.5 |
| 9,653,680 | B2 | 5/2017 | Pillarisetty et al. |
| 9,859,001 | B2 | 1/2018 | Lee et al. |

(Continued)

FOREIGN PATENT DOCUMENTS

CN 107195777 A 9/2017

OTHER PUBLICATIONS

Lv e tal. "Atomic View o fFilament Growth in Electrochemical Memristiv eElements." Scientific Reports,www.nature/scientific reports,DOI:10.1038/srep13311-ReceivedMay 21,2015,Accepted Jul. 20,2015,Published Aug. 21, 015.SciRep5,13311.*

(Continued)

*Primary Examiner* — Muna A Techane
(74) *Attorney, Agent, or Firm* — Scully, Scott, Murphy & Presser, P.C.; Daniel P. Morris

(57) ABSTRACT

System and method to localize a position of an RRAM filament of resistive memory device at very low bias voltages using a scanning laser beam. The approach is non-invasive and allows measurement of a large number of devices for creating statistics relating to the filament formation. A laser microscope system is configured to perform a biasing the RRAM cell with voltage (or current). Concurrent to the applied bias, a laser beam is generated and aimed at different positions of the RRAM cell (e.g., by a raster scanning). Changes in the current (or voltage) flowing through the cell are measured. The method creates a map of the current (or voltage) changes at the different laser positions and detects a spot in the map corresponding to higher (or lower) current (or voltage). The method determines the (x,y) position of the spot compared to the edge/center of the RRAM cell.

20 Claims, 8 Drawing Sheets

(56) References Cited

U.S. PATENT DOCUMENTS

| | | | |
|---|---|---|---|
| 10,017,410 | B2 | 7/2018 | Hosseini |
| 10,269,860 | B2 | 4/2019 | Ang et al. |
| 10,361,368 | B2 | 7/2019 | Ando et al. |
| 10,903,421 | B2 | 1/2021 | Kong et al. |
| 11,508,438 | B1* | 11/2022 | Stellari ............... G11C 13/0011 |
| 2004/0114428 | A1* | 6/2004 | Morikawa ............... G11C 11/16 |
| | | | 365/158 |
| 2004/0130939 | A1* | 7/2004 | Morikawa .......... G11C 13/0069 |
| | | | 365/158 |
| 2010/0065836 | A1 | 3/2010 | Lee |
| 2014/0133211 | A1* | 5/2014 | Nazarian ............ G11C 13/0028 |
| | | | 365/158 |
| 2017/0140819 | A1* | 5/2017 | Lee .................... G11C 13/0069 |
| 2021/0066583 | A1 | 3/2021 | Park et al. |
| 2021/0242397 | A1 | 8/2021 | Kemp |

OTHER PUBLICATIONS

Niu et al. "Geometric Conductive Filament Confinemen tby Nano tips for Resistive Switching of Hfo2-RRAM Devices with High Performance." Scientific Reports,www.nature/scientificreports,DOI:10.1038/srep25757_Received Jun.5, 015,Accepted Apr. 22, 2016,Published May 16, 2016.SciRep6,25757.*

Yalon et al. "Spatially Resolved Thermometry o fResistive Memory Devices." Scientific Reports,www.nature/scientificreports,DOI:10.1038/s41598-017-14498-3.Received Jun. 6, 2017,Accepted Oct. 11, 2017,Published Nov. 10, 2017.SciRep7,15360.*

Lv et al. "Atomic View of Filament Growth in Electrochemical Memristive Elements." Scientific Reports, www.nature/scientificreports, DOI:10.1038/srep13311.Received May 21, 2015, Accepted Jul. 20, 2015, Published Aug. 21, 2015. Sci Rep 5, 13311.

Niu et al. "Geometric Conductive Filament Confinement by Nanotips for Resistive Switching of Hfo2-RRAM Devices with High Performance." Scientific Reports, www.nature/scientificreports, DOI:10.1038/srep25757.Received Jun. 5, 2015, Accepted Apr. 22, 2016, Published May 16, 2016. Sci Rep 6, 25757.

Notice of Allowance dated Sep. 20, 2022 received in U.S. Appl. No. 17/072,810, 16 pages.

List of IBM Patents or Patent Applications Treated as Related dated Dec. 9, 2021, pp. 2.

* cited by examiner

RRAM FILAMENT SPATIAL LOCALIZATION USING A LASER STIMULATION

BACKGROUND

The present disclosure relates in general to systems and methods that can locate a conductive filament being formed in resistive random access memory (RRAM) devices.

Resistive Random Access Memory (RRAM) devices have generated a lot of interest lately due to their potential applications for non-volatile on chip memory. They allow to save Silicon real estate by moving the memory up in the Back-End Of the Line (BEOL) stack. They have applications for generating and storing secrets in security applications, and they can be used in obfuscation and split manufacturing schemes.

The RRAM device consists of two conductive elements separated by a special insulating material. Initially the device has high resistivity due to the insulating material and does not conduct significant current between the two conductive elements. However, after exposing the device to an appropriate high voltage, a conductive filament may be created in the insulator so that current can flow through it. By subsequently applying negative and positive voltages, the filament can be disconnected and reconnected to the terminals thus creating a controllable resistive memory device.

Especially during the development of new manufacturing processes and materials for RRAMs, it would be very useful to easily and quickly determine the spatial (x,y) location of the filament inside the 2D area of the memory cell. This would allow to gain insight on the electric and material property of the device, especially if a statistically significant number of devices are compared.

SUMMARY

In some examples, a method for locating a filament in a resistive memory device is generally described. The method can include acquiring an image indicating a location of a filament formed in a RRAM cell device using an impinging laser beam stimulus.

The method can include using an impinging laser signal to localize the filament at a very low device bias voltage (e.g., <=100 mV) corresponding to the bias typically used for reading the cell. This technique reduces the stress on the device and prevents alterations to the electrical characteristics.

In an embodiment, a system and method is provided that is able to quickly localize the position of the RRAM filament at very low bias voltages using a raster-scanned laser signal. This approach is non-invasive and relatively quick, thus allowing to measure a large number of devices and to create solid statistics of the filament formation.

In an embodiment, the method is not invasive and allows for the quick localization of a resistive memory filament. The location can then be correlated to other electrical information about the device under test or used for subsequent physical analysis.

In some examples, a system for locating a filament in a resistive memory device is generally described. The system can include a memory and a processor. The memory can be configured to store a set of instructions. The processor can be configured to be in communication with the memory. The processor can be configured to generate images that can be used to determine a location of the filament in a switching medium of the resistive memory device using the generated images.

According to an aspect of the present disclosure, there is provided a method for determining a spatial location of a filament in a resistive random access memory (RRAM) cell. The method comprises: applying a bias signal to the RRAM cell; applying a laser signal at different positions of a surface of the RRAM cell; measuring a change in a sense signal at the RRAM cell responsive to the applied laser signal at each different surface position; creating, using a hardware processor, a map of the sense signal changes at the different laser positions; detecting, using the hardware processor, a presence of a spot in the map corresponding to a signal change at a particular surface position; determining an edge or center of the RRAM cell; and determining a 2-dimensional coordinate position of the spot compared to the edge/center of the RRAM cell, the spot indicating the location of the filament in the RRAM device.

In an embodiment, an apparatus for determining a spatial location of a filament in a resistive random access memory (RRAM) cell. The apparatus can include a signal generator for applying a bias signal to the RRAM cell; a laser signal generator for applying a laser signal at different positions of a surface of a RRAM cell; a detector for measuring a change in a signal sensed at the RRAM cell responsive to the applied laser signal at each different surface position; a memory configured to store a set of instructions; and a hardware processor, in communication with the memory, the set of instructions configuring the hardware processor to: create a mapping of the measured sense signal changes corresponding to the different surface positions; detect a presence of a spot in the map at a particular surface position; determine an edge or center of the RRAM cell; and determine a 2-dimensional coordinate position of the spot compared to the edge/center of the RRAM cell, the spot indicating the location of the filament in the RRAM device.

Further features as well as the structure and operation of various embodiments are described in detail below with reference to the accompanying drawings. In the drawings, like reference numbers indicate identical or functionally similar elements.

DETAILED DESCRIPTION

A resistive random access memory (RRAM) device can be switched among multiple states, where the states can be characterized by the RRAM device's resistance. In an example, to program the RRAM device, a voltage can be applied to the RRAM device to connect a conductive filament through the switching medium or insulating layer. The connection of the filament can cause the RRAM device to switch from a relatively high resistive state (e.g., when the conductive filament is disconnected), to a relatively low resistive state. In some examples, reset (an erase) process can be implemented to reverse the RRAM back to the relatively high resistive state. The changes to the resistive states of the RRAM device can be either binary to represent zero or one or analog to represent intermediate states between zero and one.

Figure 2:
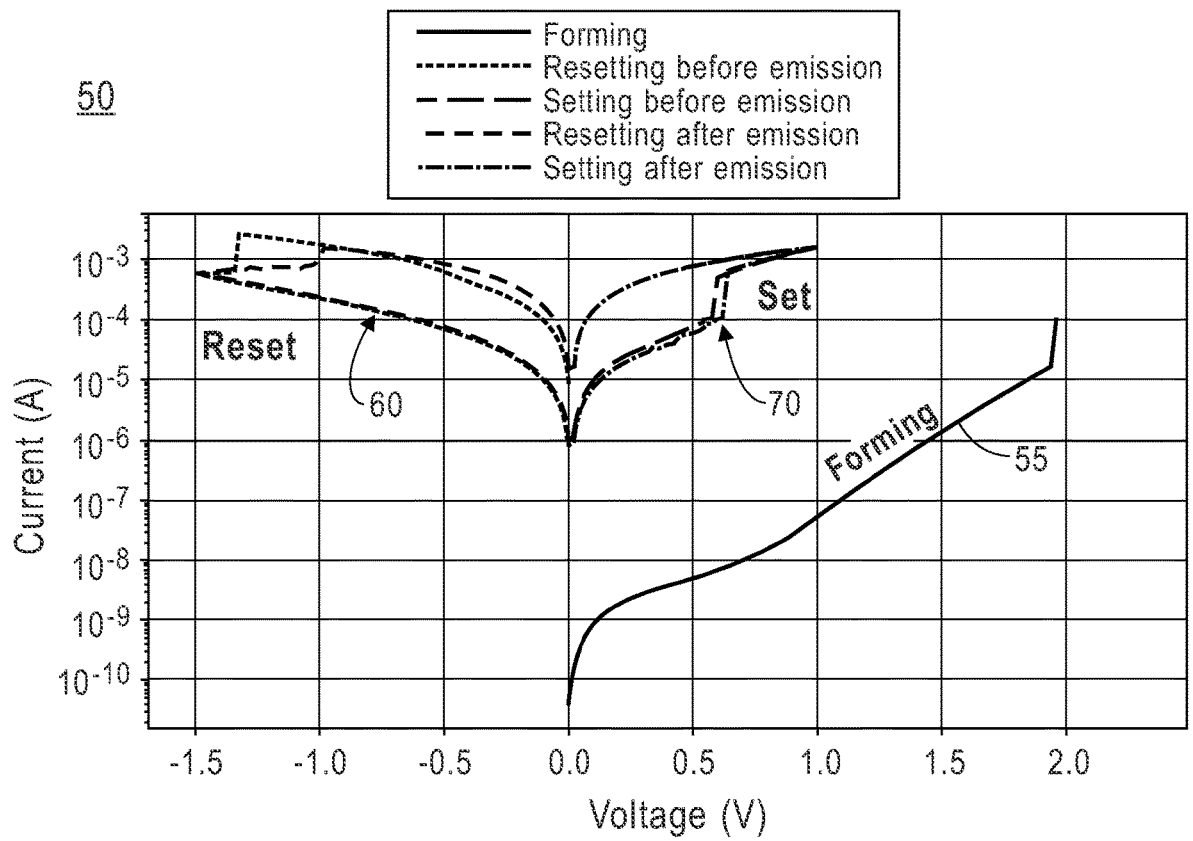
FIG. 2 is a diagram showing the I-V characteristics of a RRAM device during forming, resetting, and setting cell states.

FIG. 2 shows a plot depicting the I-V characteristics 50 of a working RRAM cell. As shown in FIG. 2, various operations govern the RRAM resistive element device behavior. Initially, a first state of most RRAM devices is an initial very high resistance state, in which the RRAM resistance is a much higher resistivity than a High Resistance State (HRS) which is a resistance state considered higher than a specific value. As shown as curve 55 in one of the current-voltage (I-V) curves of FIG. 2, a first operation is a "forming" operation in which an applied voltage across the device exceeds a certain level, i.e., a forming voltage level, and the RRAM responsively starts changing its state from the initial very high resistance state to a low resistance state (LRS). LRS means that the RRAM resistance is less than a certain value. The LRS resistance is preferred to be smaller than the HRS resistance by a sufficient amount so that a supporting circuit is able to discern the RRAM state unambiguously. The forming operations involve a process requires a high voltage.

After the forming operation in which the RRAM devices are rendered into a LRS, to transition the RRAM device operation between low resistance and the high resistance states, a reset operation 60 is performed in which the applied voltage across the device sweeps negatively and upon exceeding a certain "reset" voltage limit, the RRAM device will change the state from LRS back to the HRS. When the voltage changes to positive again and exceeds another "set" voltage limit, the RRAM will change its state from HRS to LRS. This process is called a SET operation 70 as illustrated in FIG. 2. The RRAM device can be worked back and forth between HRS and LRS by respective RESET and SET operations wherein a sufficiently low negative voltage RESETs the device, and a sufficiently high positive voltage can SET the device, i.e., LRS (after set)<HRS (after reset). If the polarity of the "reset" voltage is different from that of the "set" voltage (and forming voltage), the RAM device is called a bipolar-switching device as shown in FIG. 2. For most RRAM devices, the forming operation applies a higher forming voltage, $V_{FORMING}$, (>set voltage) to induce the transition from the very high resistance state to the LRS.

The resistive memory device is first formed by progressively increasing the positive bias voltage until a sudden increase in conductivity is observed, corresponding to the formation of a filament. Subsequently negative reset and positive set cycles are performed to verify that the device is working properly.

Figure 4:
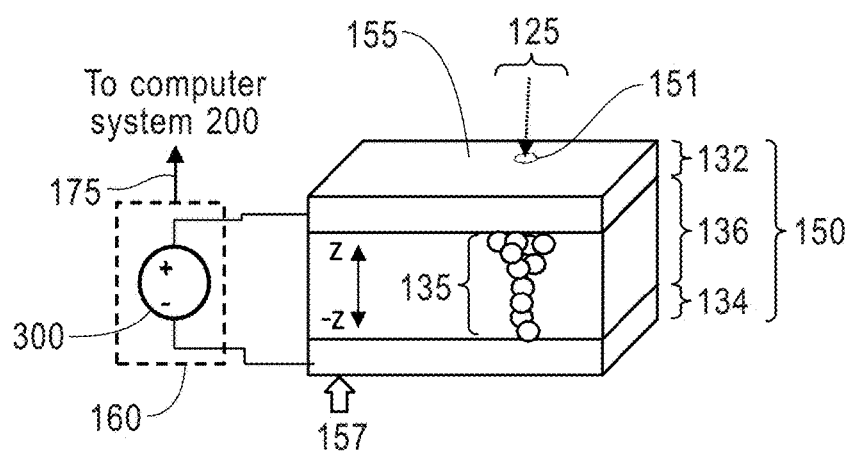
FIG. 4 depicts a cross-sectional view of a resistive memory device including a first conductive element or electrode, a second conductive element or electrode, and a layer of switching medium located or situated between the electrodes.

FIG. 4 depicts a resistive memory device 150 that includes at least a first conductive element or electrode 132, a second conductive element or electrode 134, and a layer of switching medium 136 that can be located or situated between the electrodes 132 and 134. The electrodes 132 and 134 can be made of conductive materials, such as various kinds of metals or alloy including rhodium, titanium, aluminum, copper, tungsten, iridium-ruthenium alloy, and/or other types of metal or conductive materials. As an example, top electrode 132 and bottom electrode 134 are TiN material layers. The top and bottom electrodes do not have to be transparent. The switching element 136 can be a layer of dielectric or insulating materials, such as layered amorphous silicon (a-Si), metal oxides, silicon oxides, Hafnium oxide ($HfO_x$), and/or other types of dielectric materials. It shall be apparent to a person of ordinary skill in the art that other materials can be used for forming the electrodes 132 and 134, and/or the switching dielectric medium 136.

In an example, a particular amount of a bias (i.e., voltage or current signal) is applied to the resistive memory device 150 to form a conductive filament (herein "filament") 135 in the switching medium 136. The formation of the filament 135 can cause the switching medium 136 to be conductive through a conductive path, such as the filament 135. That is, the formation of the filament 135 can cause the resistive memory device 150 to operate in a low resistance state. The filament 135 can be formed based on different mechanisms, such as vacancy or metal defect migration, and/or other mechanisms. In an example, the resistive memory device 150 can be reset by breaking the filament 135, where breaking the filament 135, or the absence of the filament 135, can switch the resistive memory device 150 to operate in the HRS.

In embodiments, a sense signal 175 (e.g., a current flowing through the resistive memory device 150 or voltage measured at the resistive memory device) is affected by the presence of the laser beam impinging at the initially unknown filament location. The current is not changed if the laser is at other locations without a filament.

Figure 3:
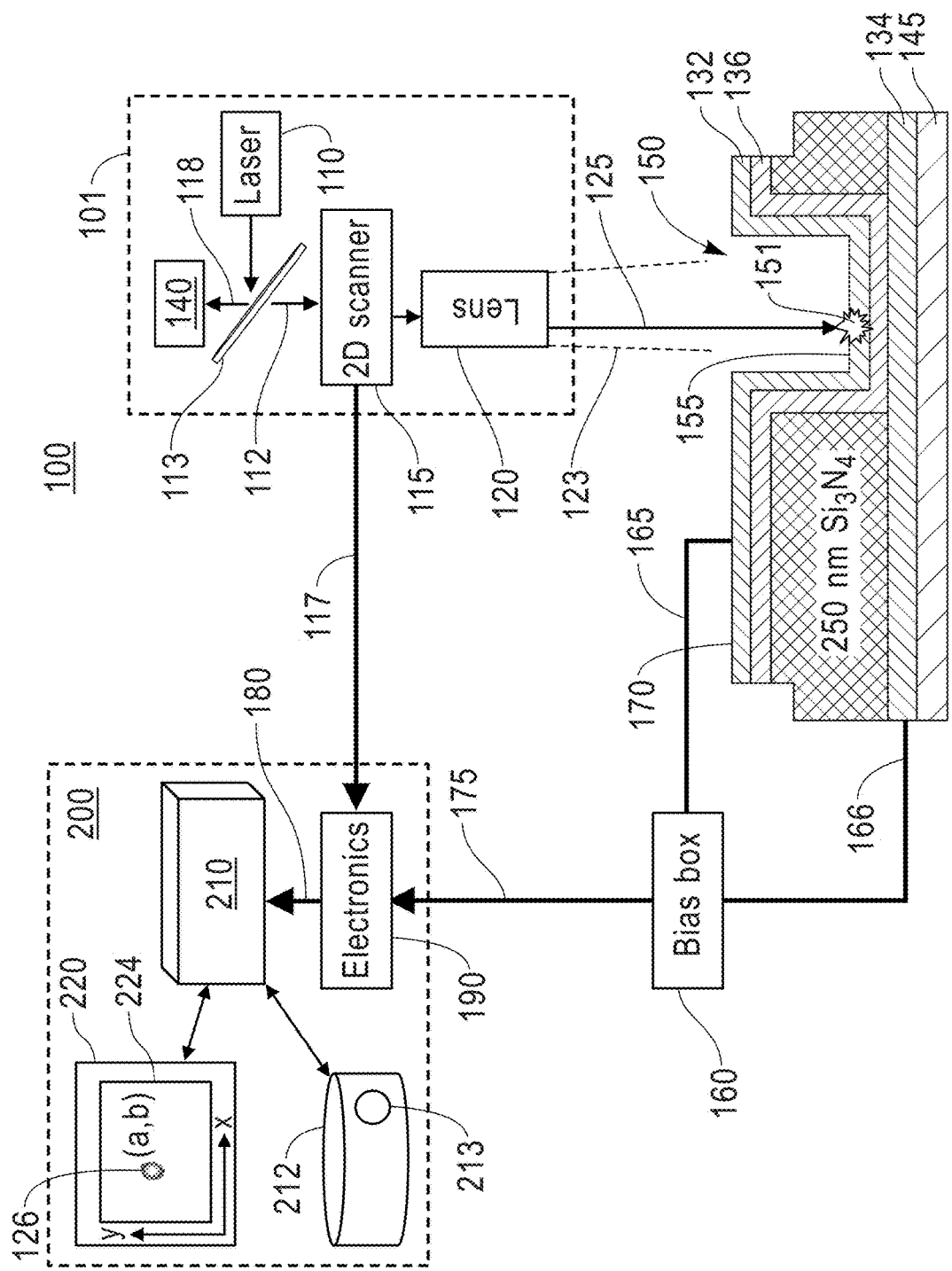
FIG. 3 is a diagram showing an example system that can implement RRAM filament location based on a laser scanning microscope system in an embodiment.

FIG. 3 is a diagram showing an example laser scanning system 100 that can implement a conductive filament location in an RRAM device using a computer-based laser scanning microscope (LSM) 101 in an embodiment. The system 100 is operable under control of a computing device 200, including, for example, a computer, a processor, a microprocessor, a controller, a microcontroller, or a system on chip (SoC) device. As shown in FIG. 3, the laser scanning system 100 includes a laser device 110 that generates a laser signal (e.g., laser beam) and feeds the laser signal 112 via a dichroic mirror 113 to a two-dimensional scanning device 115 that adjusts the current two-dimensional scanner position under x-y control to a desired location 151 on the RRAM device 150. In an embodiment, the scanning device 115 adjusts the position of the impinging laser spot 151 on the surface 155 of a RRAM device 150 through objective lens 120. In an embodiment, the registered laser signal 125 is focused using one or more objective lens 120 configured to focus the laser signal 125 for impingement as a spot 151 at desired surface locations of the RRAM device 150. In an embodiment, a cavity 123 is defined between the lens and surface 155 of the RRAM device 150 through which the laser beam signal 125 is scanned. The objective working distance between the lens and the RRAM surface is determined by the choice of the objective lens 120 which may vary from about 10 mm to about 1 mm. Some lenses (e.g., such as solid immersion lenses) require contact with the samples and cannot therefore work in a cavity as depicted in FIG. 3.

In an embodiment, two-dimensional scanning device 115 registers each current location coordinate of the optical laser beam according to an x, y (2-dimensional) coordinate system and records the current laser beam scanner (x, y) position by sending a 2-D scanning position data as (x,y) coordinate signals 117 for receipt at computing system 200. In an embodiment, (x,y) coordinate signal 117 may be a digital number representing the coordinates (x,y) digitized by the 2D scanner head 115 and alternately referred to as a laser position signal or scanner head position signal. In another embodiment, (x,y) coordinate signal 117 may be an analog signal produced by the scanner head 115 representing its current position. Such analog signal may be digitized into a numerical value by electronic circuit(s) 190. For example, electronic circuits can comprise an analog (e.g., voltage or current) signal receiver, a digital signal receiver, analog to digital converters, signal filters, storage devices, etc.

In an embodiment, prior to impinging a laser beam spot 151 at surface locations of the RRAM device 150, a voltage bias generator and measurement module 160 is actuated to simultaneously provide a bias signal to the RRAM cell 150. In an embodiment, bias signal 165 is a constant current signal or bias voltage signal applied to a conductive pad area 170 that is electrically conductive to an electrode, e.g., top electrode 132, of RRAM cell 150 at the time of the application of the laser bean spot 151. In an embodiment, the voltage bias generator 160 provides a bias signal 165 (e.g., a constant voltage) relative to a ground voltage potential 166 that is applied to the opposite electrode, e.g., a connection to a bottom electrode 134 of RRAM cell 150. In an embodiment, the voltage bias generator 160 measures a current (or voltage) corresponding to the application of the constant voltage (or current) bias signal 165 to the pad area 170 of the RRAM cell and the impinging laser bean spot 151 at each scanned (x,y) position. The measured current (or voltage) is reported to the electronic circuit(s) 190 as sense signal 175 which may be a digital number or an analog signal representing the measured current or voltage value that is later digitized by electronic circuit(s) 190.

The computing system 200 of FIG. 3 includes an electronic circuit 190 that receives the (x,y) coordinate signal 117 from the LSM scanner head and the measured current (or voltage) value of sense signal 175 from the voltage bias generator and measurement module 160, time correlate them (i.e., synchronize the signals if they are not synchronized, or make sure that there is one and only one measured value of current or voltage for a given scanner position). In an embodiment, one or more of laser position signals 117 or sense signal 175 may be analog values, in which case the electronic circuit 190 also correctly interprets such signals and converts them into digital numerical values that can be understood by the computing system 200. In an embodiment, for each (x,y) position of the 2-D laser signal scanner, the electronic circuit 190 receives (x,y) coordinate signal 117 indicating the current (x,y) RRAM surface scan location and receives the respective obtained measurement sense signal 175 indicating the "color" of the recorded (x,y) pixel location of RRAM device surface. The color of each recorded (x, y) pixel location of RRAM device surface is recorded by the computing system 200. All measured sense signals 175 processed for all scanned (x,y) pixels are colored to produce a final "color" image 224 such as a color map of the RRAM surface with each (x, y) pixel of the color map image being "colored" based on the data values of the measured device sense signal 175 (e.g., current or voltage) at the different locations.

In an embodiment, for each laser scanned (x, y) position, a processor 210 of computer system 200 can receive the data 180 from the electronic circuit(s) 190, another computing device, and/or other types of computing or optical devices. The processor generated "color" image 224 can be an image of at least a portion of the resistive memory device 150. In the example shown in FIG. 3, the image 224 can be an image of a surface 155 (e.g., top surface) of the resistive memory device 150. In some examples, the image 224 can be an image of another surface 157 (e.g., bottom surface) of the resistive memory device 150, which may be acquired through the substrate 145 of the wafer.

FIG. 3 further shows the provision of an optical device 140, such as a camera or light sensor, in the laser scanning microscope 101. This optical device 140 can be a charge-coupled device (CCD) configured to acquire light to generate images, in particular, acquire and record the level or intensity of reflected laser light 118 reflected from surface of the resistive memory device at each scanned pixel location. In an embodiment, the objective lens 120 laser scanning microscope system 101 can be configured to obtain reflected light data, becoming data 180 that can be rendered into a pattern image. The optical device 140 can send this data to computer system 200 for receipt at electronic circuit 190 as part of (x,y) coordinate signals 117 to generate a pattern image of light reflected from locations at the surface 155 (e.g., top surface) of the resistive memory device. This generated pattern image can be analyzed in conjunction with (x, y) colors of the generated color map of the RRAM surface to determine the spatial location of a formed RRAM device filament.

Figure 1:
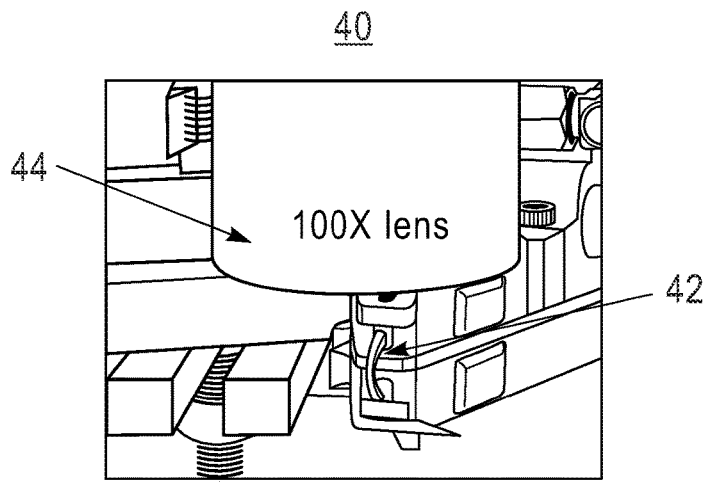
FIG. 1, there is depicted an individual RRAM device electrically biased and imaged using an objective lens while a is raster scanned across the device.

Referring to FIG. 1, there is depicted a portion of a laser scanning microscope 40 used for probing an individual RRAM device while a 1300 nm laser is raster scanned across the device. A probe 42 contacts the RRAM device and provides the voltage bias while scanning. Any reflected light signals or emissions are collected with a 100X objective lens 44. In particular, lens 44 is used to both focus the laser on the device and measure the reflected light from the device, which is used to generate the pattern image.

Figure 5:
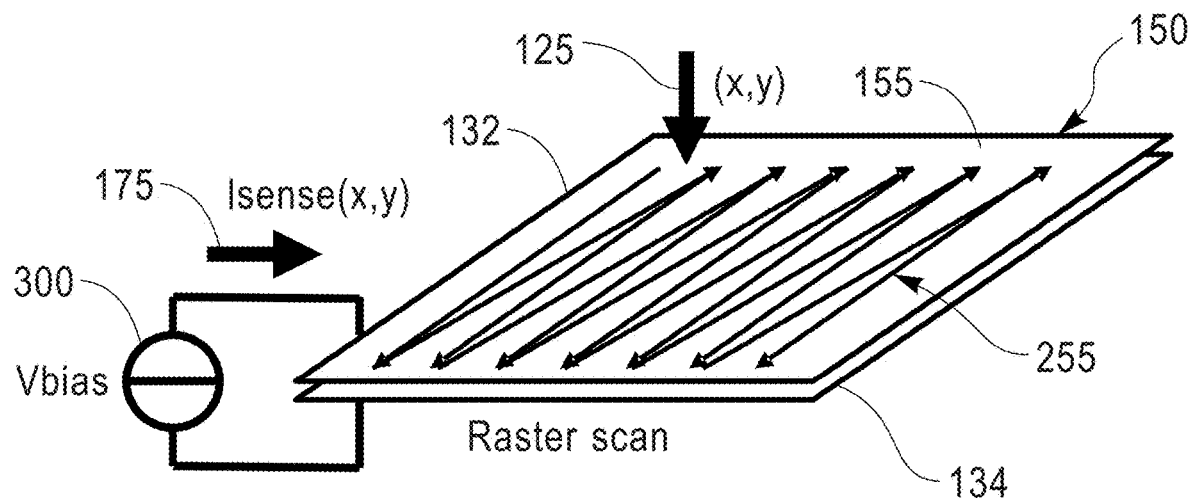
FIG. 5 depicts an example scanning of the laser beam signal by scanning laser microscope system of FIG. 3.

In an example, FIG. 5 depicts the scanning of the laser beam signal 125 by scanning laser microscope system 100 of FIG. 3. A user-selected lase power and bias voltage are fixed during the spatial location of the filament. An area of interest of the RRAM is scanned by the scanner at a user-selected scan speed, thereby controlling laser beam impingement dwell time at a particular RRAM surface location.

As shown in FIGS. 4 and 5, laser beam signal 125 is generated and scanned to impinge at (x, y) coordinate locations on a top surface 155 (or bottom surface) of the resistive memory device 150 while a bias voltage 300 is applied across the top and bottom electrodes 132, 134 to configure a particular device state (e.g., set, reset, etc.) of the RRAM device. Depending upon the additional laser beam signal 125 stimulus applied to the cell surface, the carriers moving from one electrode to the opposite one (e.g., from element 132 to element 134, or from element 134 to element 132) along the formed or partially-formed filament 135 in the dielectric medium (e.g., switching medium 135) can alter the sense signal 175 (e.g., current flowing in the device or voltage across the device). For example, there may be produced additional current dependent upon the certain conditions of device operations, i.e., applied voltage bias.

Referring to the partial system implementation of FIG. 4, the bias box 160 generates and applies a low bias voltage 300 to the cell 150 (e.g., a typical read voltage of 100 mV) while the laser signal 125 is scanned across the surface of the cell. For each laser position $(x_1, y_1)$, the sense signal 175 (e.g., current, voltage, a device resistance or a device capacitance) at the device is measured at the voltage bias generator box 160 and reported to computer system 200. The computer circuitry responsively organizes the measured device sensed signal data for each scanned (x, y) pixel location according to one or more of: a table, matrix, a false-color image, etc. In one embodiment, a constant voltage bias 300 may be applied to the device while the laser position dependent current is measured. Alternatively, a constant current may be applied to the device while a laser position dependent voltage across the device is measured. In either implementation, for each scanned (x, y) position, the voltage bias generator 160 provides a measurement of the current for recordation thereof.

In view of FIG. 4, the impinging laser beam spot 151 upon the surface of the RRAM device temporarily alters the structure or conductance of the filament, if an only if the spot 151 is in close proximity with the location of the filament. For example, in one embodiment, the local laser spot may locally increase the temperature of the device thus changing its conductivity. If a filament is ohmic/resistive, a higher temperature may increase its resistance and therefore temporarily decrease the measured current. If a barrier of some kind is involved, then higher temperature may make it easier for carriers to pass the barrier and therefore increase the measured current. In a different embodiment, possibly when a shorter wavelength laser is used, the energy of the photon may be sufficient to generate carriers and therefore alter (by increasing) the current flow that way.

Additionally, as shown in FIG. 5, the laser may be impinged from either the top or bottom side of the device. In an embodiment, different scanning speed and scanning directions 255 can be employed to improve the signal to noise ratio (SNR) of the acquired data and/or the accuracy of the filament localization. For example, raster scan frequency can be controlled to significantly change from fraction of a seconds to minutes, depending on the response delay of the device. For example, being largely a capacitance, the device's current/voltage may not change fast, and a slower scan speed, longer dwell time, may produce an improved signal to noise ratio (SNR).

Referring back to the system 100 depicted in FIG. 3, the electronic receiver receives the (x, y) coordinate signal 117 from the scanner and the measured sense signal 175 (e.g., current or voltage) from the voltage bias generator 160 and the computer system 200 generates a "false color" image where an image pixel $(x_i, y_i)$ corresponding to a scanner position $(x_s, y_s)$ is "colored" based on the measured current. For example, a gray scale image may be used where the intensity of the pixel is proportional to the measured current in a given rage, e.g., a high intensity means higher current.

In another example, a color map may be used to convert a current value into a pre-determined color, e.g., a measured high current yields a red pixel, a measured low current yields a blue pixel. In other cases, pixels with low current may be not colorized or made transparent.

Figure 6A:
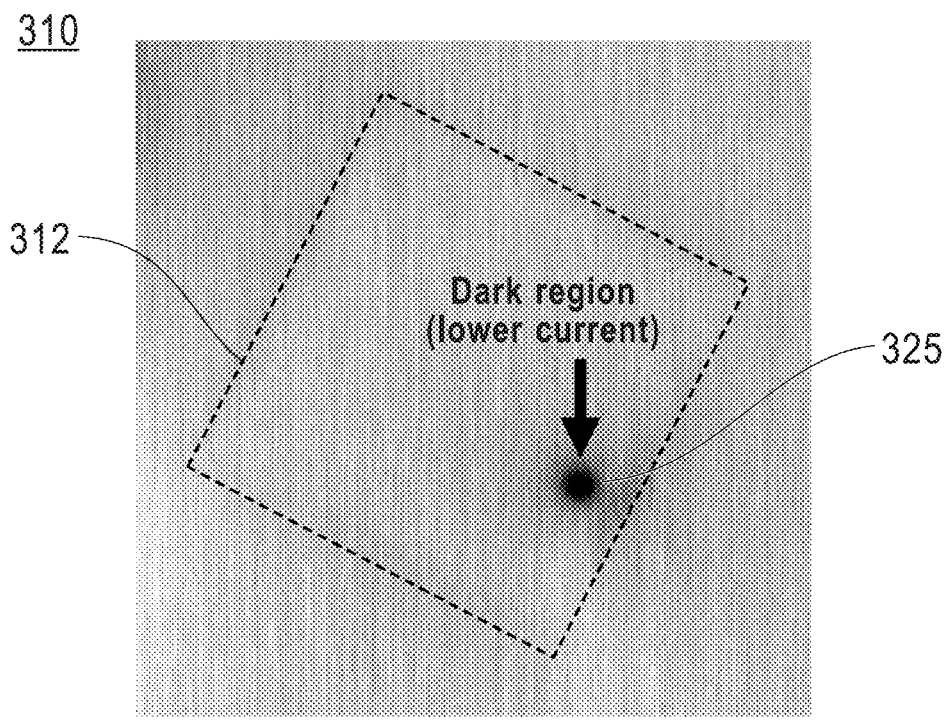
FIGS. 6A, 6B show example results of respective mappings, performed by computer system, of the current (or voltage) measured during the laser scanning into a false-color image maps.
Figure 6B:
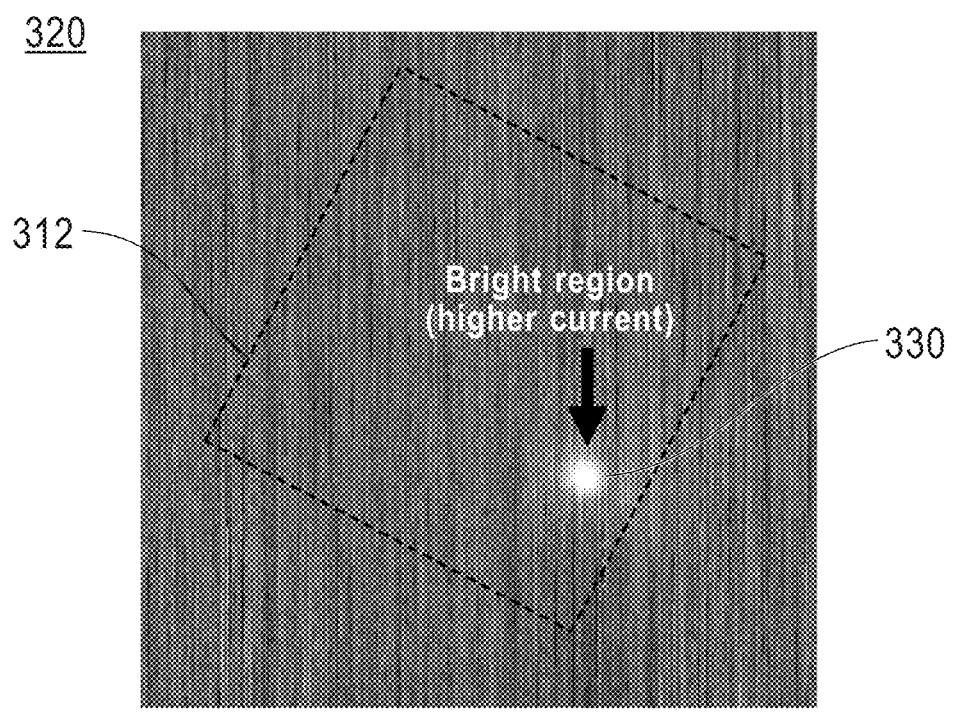

For example, the recorded (x, y) data values are analyzed to determine the presence of a region in the resistive memory device with higher (or lower current). FIGS. 6A, 6B show an example results of a mapping, performed by computer system 200, of the current (or voltage) measured during the laser scanning into a false-color image 310, 320, respectively, where the pixel location represents a specific laser position (xl, yl) and the intensity/color represents an absolute or relative change in the measured current (or voltage). For example, the color image 310 of FIG. 6A shows a resulting mapping of the laser scanning of RRAM cell surface 312 based on the measured currents (or voltages) in which a circular dark region 325 results indicating a location where the current is decreased upon the application of the laser at that location. Alternatively, for example, the color image 320 of FIG. 6B shows a resulting mapping of the laser scanning of the same RRAM cell surface based on the measured currents (or voltages) in which a circular bright region 330 results indicating a location where the current is increased upon the application of the laser at that location. Thus, for example, if a gray scale color map is used, a white color can mean a larger current than black, i.e., the presence of a filament formed in the RRAM device 150 corresponding to the particular scanned (x, y) location. Likewise, using a gray scale color map, a black color can mean a small current than white indicating the absence of a filament formed in the RRAM device 150 corresponding to the particular scanned (x, y) location. It is noted that that the bright/dark region represents the location of the filament that is previously unknown and may change from cell-to-cell or sample-to-sample.

In an embodiment, the respective bright/dark regions 325, 330 shown in respective FIGS. 6A, 6B are analyzed to identify a location, i.e., an (xs, ys) position of its spot center corresponding to its maximum or minimum depending on the fact that the region shows as bright or dark. This can be achieved, for example, by computing a centroid of the data represented as a false color image. Alternatively, the data may be represented as a matrix and a suitable functional shape, such as a 2D Gaussian could be fitted to the data to determine the center. In even another embodiment, a circular shape of variable center and radius could be filled to the spot region and the center of the fitted circle be used to determine (xs, ys).

More particularly, in an embodiment, from the color maps generated in FIGS. 6A, 6B, the maximum of the current (or image intensity) is an indication of the filament position, i.e., the filament location is defined as the image pixel location (xi, yi) corresponding to the highest measured current/intensity. It is understood that the location of the current maximum (or image intensity) can be computed according to a variety of ways: For example, a centroid can be computed and used with false color image data to determine filament location. Alternatively, a suitable functional shape such as a 2D Gaussian curve is formulated and can be fit to the data to determine a center of the identified spot. For example, a 2D filter may be applied to reduce the noise and smooth the image, for example a low pass Gaussian filter, a median filter, etc. In a further method, a circular shape of variable center and radius is formulated and could be filled to the spot region and the center of the fitted circuit used to determine the filament location $(x_s, y_s)$. For example, a threshold may be applied to the image first, a formulated circle with unknown center ($x_c, y_c$) and radius r may be fitted to the patch resulting from the thresholding. In this case, the filament location is defined as the ($x_c, y_c$) of the optimal fitting circle. In another embodiment, the filament location is defined as the location of the center of a suitable functional shape (e.g., a 2D gaussian) fitted against the data. In a further embodiment, the filament location is defined as the location of the 2D centroid of the image intensity. The various formulations can be constructed using Python OpenCV, Matlab and many other analysis software providing high level functional capabilities.

The process to identify the (xs, ys) position of its spot center is performed by the computing system 200. As shown in FIG. 3, in an embodiment, computing system 200 includes at least one processor 210 and a memory 212. The processor 210 can be configured to be in communication with the memory 212. In some examples, the memory 212 can be a component of the processor 210, such as being embedded on the processor 210. In some examples, the processor 210 and the memory 212 can be embedded on the same computer chip. The memory 212 can be configured to store a set of instructions 213. The processor 210 can be configured to execute the set of instructions 213 to implement the system 100 to determine a location of a filament being formed in a switching medium of a resistive memory device 150, where the resistive memory device 150 can be a resistive random access memory (RRAM) device.

In an example embodiment, the processor 210 can include a display 220 for displaying the image, e.g., a color map 224, corresponding to the received data 180 including the measurement sense signal values 175 (e.g., current or voltage) associated with the particular scanned (x, y) locations based on (x,y) coordinate signals 117. The image 224 is generated using the measurement data provided by the laser scanning system 101.

Figure 7:
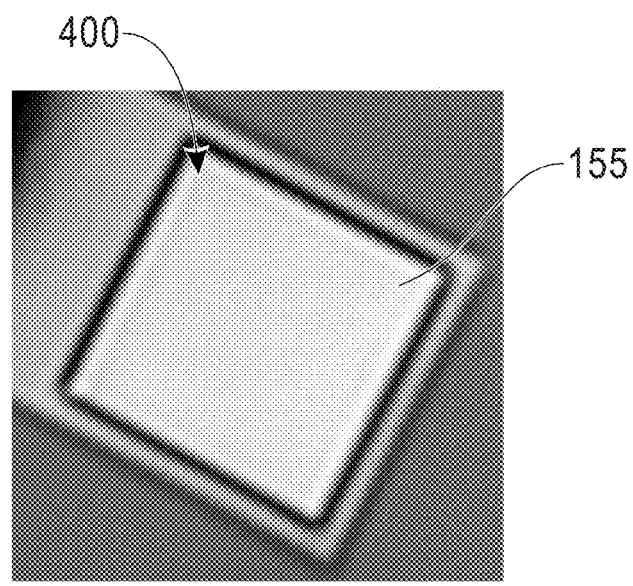
FIG. 7 shows a top-down view of an image pattern of as surface of the same RRAM cell of FIGS. 6A, 6B.

In a further embodiment, as the laser scans across the device surface, some of the impinging light is reflected back through objective lens 120 and measured by the laser scanning microscope system 101. The intensity of such reflected light is used to create a further pattern image, e.g., more reflection or greater intensity of light received, brighter white, and less reflection or reduced intensity of light received, less bright. FIG. 7 shows a top-down view 400 of an image pattern of the same RRAM cell of FIGS. 6A, 6B. The image clearly shows the surface of the cell and its perimeter but not evidence of the filament that has been formed. The intensity of the reflected light may depend on the bias conditions, for example, higher currents and higher voltages can produce higher current intensity. In some cases, the current intensity can increase linearly with the current in the cell.

For each laser scanned position (x, y), the system 100 measures the current to generate the signal image, e.g., color map of FIGS. 6A, 6B, and the reflected light is used to generate the pattern image, e.g., image of FIG. 7. Thus, the signal and pattern image are automatically registered to each other by construction. Thus, along with the signal image shown in FIG. 6A, 6B, a pattern image of the RRAM cell is also acquired as shown in FIG. 7. The two images are intrinsically registered to each other because, for example, are acquired with the same laser scanning microscope (LSM) system, or because registration and calibration methods have been developed using a known reference sample.

One exception to automatic registration relates to a slow phenomenon and too fast a laser scan, where the current change may happen with a significant delay compared to the laser (pixel) impingement dwell time thus showing up at an offset. In an embodiment, this issue can be ruled out by changing the laser scan speed and direction of the scan and making sure that the spot indicating the filament does not move. If it moves, then the scan speed needs to be reduced.

Figures 8A, 8B:
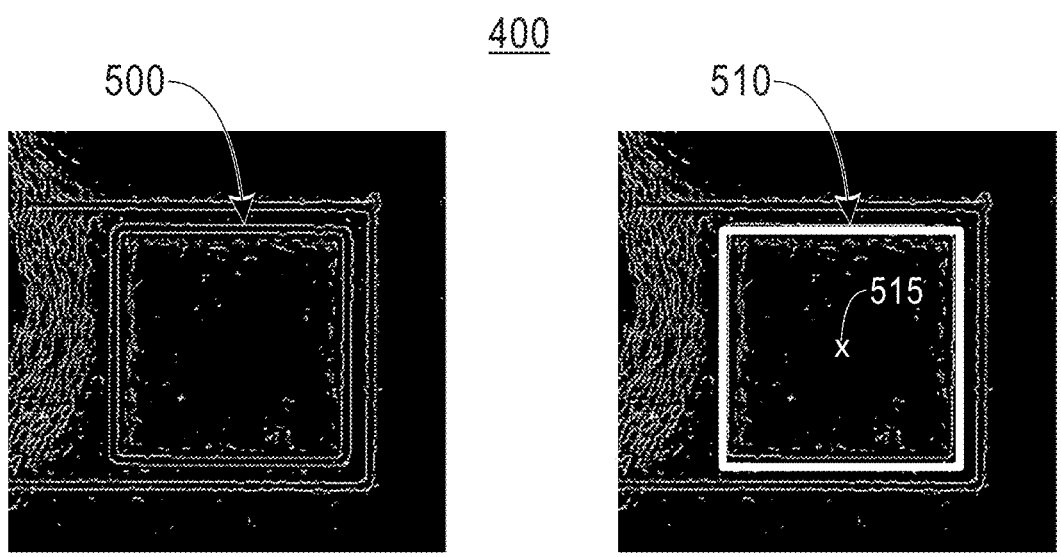
FIG. 8A depicts a reflected light image of a RRAM cell in an example embodiment.
FIG. 8B depicts a reflected light image of the RRAM cell of FIG. 8A shown with a detected edge in an example embodiment.

FIG. 8A shows a resulting pattern image 500 generated by the obtained light reflected from the resistive memory device surface positions being scanned. In an embodiment, the obtained pattern image 400 of FIG. 7 is denoised (e.g., using a median or low pass filter) and processed with an edge detector to highlight the edges 500 of the RRAM cell 400 as shown in FIG. 8A. FIG. 8B depicts a reflected light image of the RRAM cell of FIG. 8A shown with a detected edge in an example embodiment. In particular, as shown in FIG. 8B, the computer system further generates a geometrical shape, e.g., a square 510, that is fitted to match the highlighted edge of the cell. Computer system 200 further determines the cell center, e.g., center coordinate location (xc, yc), as shown by the location "x" 515 in the pattern image obtained by reflected light. The size of the fitted geometrical shape 510 is also determined in image pixels, Sp. For example, the size of the resistive memory device cell in microns is Sm, e.g., about 20 um.

In an embodiment, in view of the highlighted edge of the square 400 depicted in FIG. 8A and in view of the geometrical shape 510 fitted to match the edge of the cell as depicted in FIG. 8B, the location of the filament (X, Y) in microns inside the RRAM cell is then computed according to the following equation:

$$X = Sm/Sp*(xs-xc) \text{ and } Y = Sm/Sp*(ys-yc)$$

where Sm is the size of the resistive memory device cell in microns, Sp is the size of the fitted geometrical shape, (xs, ys) is the location of the coordinate where the determined bright spot or dark spot (FIGS. 6A, 6B) is located in the image data obtained from the current or voltage measurement, and the (xc, yc) is the location of the center coordinate location obtained from the reflected image data of the pattern image (FIG. 8B).

Figure 9:
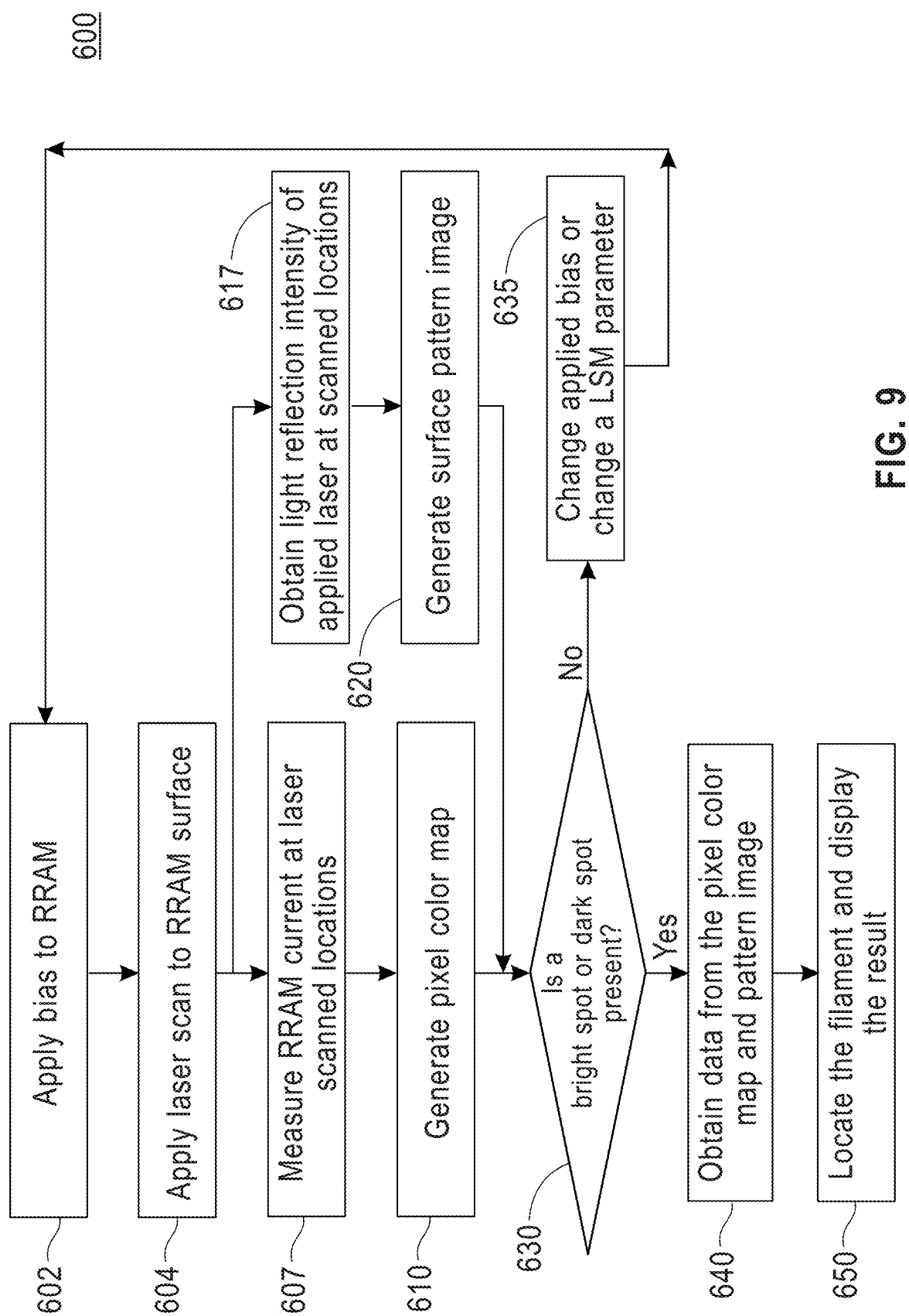
FIG. 9 depicts a diagram illustrating a process under control of a laser scanning microscope system of implementing RRAM filament location based on applied laser signal in one embodiment.

FIG. 9 depicts a diagram illustrating a process 600 under control of a computing system, e.g., laser scanning microscope system 100, of implementing RRAM filament location based on applied laser signal in one embodiment. The process 600 can include one or more operations, actions, or functions as illustrated by one or more of the blocks. Although illustrated as discrete blocks, various blocks can be divided into additional blocks, combined into fewer blocks, eliminated, or performed in parallel, depending on the desired implementation.

The process 600 can begin at block 602 where a bias supply device (e.g., device 160 shown in FIG. 3) can apply an amount of bias voltage and/or bias current to a resistive random access memory (RRAM) device (e.g., resistive memory device 150 shown in FIG. 4 or 5). In an embodiment, the amount of voltage bias applied to the resistive memory device is sufficient to cause at least one of: forming the conductive filament, setting the resistive memory device, resetting the resistive memory device, reading the state of the resistive memory device, and/or stressing the resistive memory device at elevated voltage over time. This bias may range from between the 0V level to 3 V in order to take measurements close to LRS, HRS device switching states or forming voltage states. The voltage/current bias values and ranges are strongly RRAM technology dependent and may significantly vary over time ad across different types of cells.

In an example case, a very low bias voltage can be applied, e.g., 10 mV, to avoid state perturbation. In another case, it is possible to take the measurements close to the RRAM device switching condition (e.g., about a 1V order of magnitude) or forming voltage condition (e.g., about a 2V order of magnitude). The current is determined by the device conduction at the selected bias. The device could be further operated at a constant current and the voltage being measured.

In FIG. 9, the process 600 can continue to block 604 where the laser microscope system 100 applies a scanning laser signal to the surface of the RRAM device 150, e.g., in the manner as depicted n FIG. 5. Initially, operating conditions and scanning system parameters for the scanning laser signal are selected, such as including, but not limited to: a power level, laser frequency, scan speed, area of interest to be scanned, etc. For example, the commonly available laser wavelength can be about 1064 nm (e.g., 1100 nm) and about 1300 nm. Shorter wavelengths may be used to achieve better spatial resolution and filament isolation at the cost of potentially less penetration into the device surface. Different laser wavelength may also be used to stimulate different physical mechanism that can change the device resistivity at the filament location. A shorter laser signal wavelength reduces the penetration of the laser through the TiN RRAM device electrode. Shorter wavelengths may be used to cause photoelectric phenomena where carrier energy may be altered by the laser energy or to generate carriers, while longer wavelengths are better suited to temporarily change the local temperature of the device at the laser spot and its resistivity. The laser wavelength may be changed while achieving similar effects.

Then, at 607, there is obtained a measurement of the cell device current responsive to the application of the laser signal at the scanned pixel location. As mentioned, for each scanned (x,y) position, the bias box 160 provides a measurement of the current. The electronic signal receiver 190 receives the (x,y) position from the two-dimensional scanner 115 and the measured sense signal (e.g., current) from the bias box and generates a false color image where each image pixel (xi, yi) corresponds to a scanner position (xs, ys) is "colored" based on the measured current. Steps 604 and 607 are run for the whole area of interest of the scanned RRAM device surface and at 610 the system 200 generates a color image map (e.g., grey scale of false colors) of the scanned RRAM device surface based on the measured current values such as shown in FIGS. 6A, 6B.

Simultaneous with laser scanning and current measuring at 607, light reflections from the laser signal impinging on the RRAM surface are obtained by the laser microscope system. In particular, at 617, the intensity of the light reflected from the surface of the cell 150 at the scanned locations is recorded at the LSM system 100. At 620, the computer system can then generate a pattern image based on the reflected light such as shown in FIGS. 8A, 8B.

Continuing to 630, FIG. 9, the system makes a determination of whether a bright spot or dark spot is present in the generated pixel color map which would indicate the presence or not of a formed filament in RRAM device. If no bright spot or dark spot is detected, this may indicate no conductive filament has been formed in RRAM device under test. In one embodiment, if no bright spot or dark spot is detected, at 635, the system can change a bias/operating condition, e.g., change the applied bias voltage or current, and/or change a laser scanning parameter, e.g., change the laser (pixel) impingement dwell time by adjusting laser frequency, scan rate, scan area or scanned pixel locations. Then the process could return to step 602 in order to repeat the measurements and update the color map/images obtained at the new bias voltage level. Otherwise, if it is determined at 630 that a bright spot is present, then based upon the gray-scale image color convention used, this indicates the formation of conductive filament within the switching medium of the RRAM device. Then, the process proceeds to 640 in order to obtain the respective Sm, Sp, (xs, ys) and (xc, yc) data from the generated pixel color map and pattern image maps, in order to compute the physical X, Y location of the filament in the switching medium of the RRAM device 150. Then at 650, based on the computed X, Y location the conductive filament is spatially located using the relation X=Sm/Sp*(xs−xc) and Y=Sm/Sp*(ys−yc) and the result may be displayed in the computer system display.

In the method 600 depicted in FIG. 9, the (x, y) locations in each of the generated color map and pattern image can correspond to the location on the surface 155 of the resistive memory device 150. The computer system executes a set of instructions 213 stored in the memory 212 to determine the X, Y location where the filament is formed in the device switching medium. For example, the processor 210 can determine that the spot 325, 330 is located at the location (X, Y) in the image 310, 320, respectively, and can determine that the filament 205 is formed in the switching medium 203 below (e.g., in the −z direction shown in FIG. 4) the location of the surface 155. In some examples, the set of instructions 213 can include image processing algorithms such as edge detection, feature extraction, pattern recognition, image filters, and/or other types of image processing algorithms. The processor 210 can be configured to execute one or more of the image processing algorithms among the set of instructions 213 to determine the location of the spot or pattern in the obtained images. In some examples, the processor 210 can display a result indicating the determined location of the filament, where the result can include text and/or images. The processor 210 can further store the determined location of the filament in the memory 212.

It is understood that, in embodiments, when an applied bias signal 165 is a voltage, the measure sense signal 175 is a current flowing through the memory device. Alternately, when an applied bias signal 165 is a current, the measure sense signal 175 can be a voltage across the memory device. Other bias signal application and measurement signal schemes are applicable. For example, when an applied bias signal 165 is a voltage, the measured sense signal 175 can include a memory device resistance measurement; similarly, when an applied bias signal 165 is a current, the measured sense signal 175 can include a memory device resistance measurement. Further, when an applied bias signal 165 is a voltage, the measured sense signal 175 can include a capacitance loss signal representing a measured change in memory device capacitance; similarly, when an applied bias signal 165 is a current, the measured sense signal 175 can include a capacitance loss signal representing a measured change in device capacitance.

Figure 10:
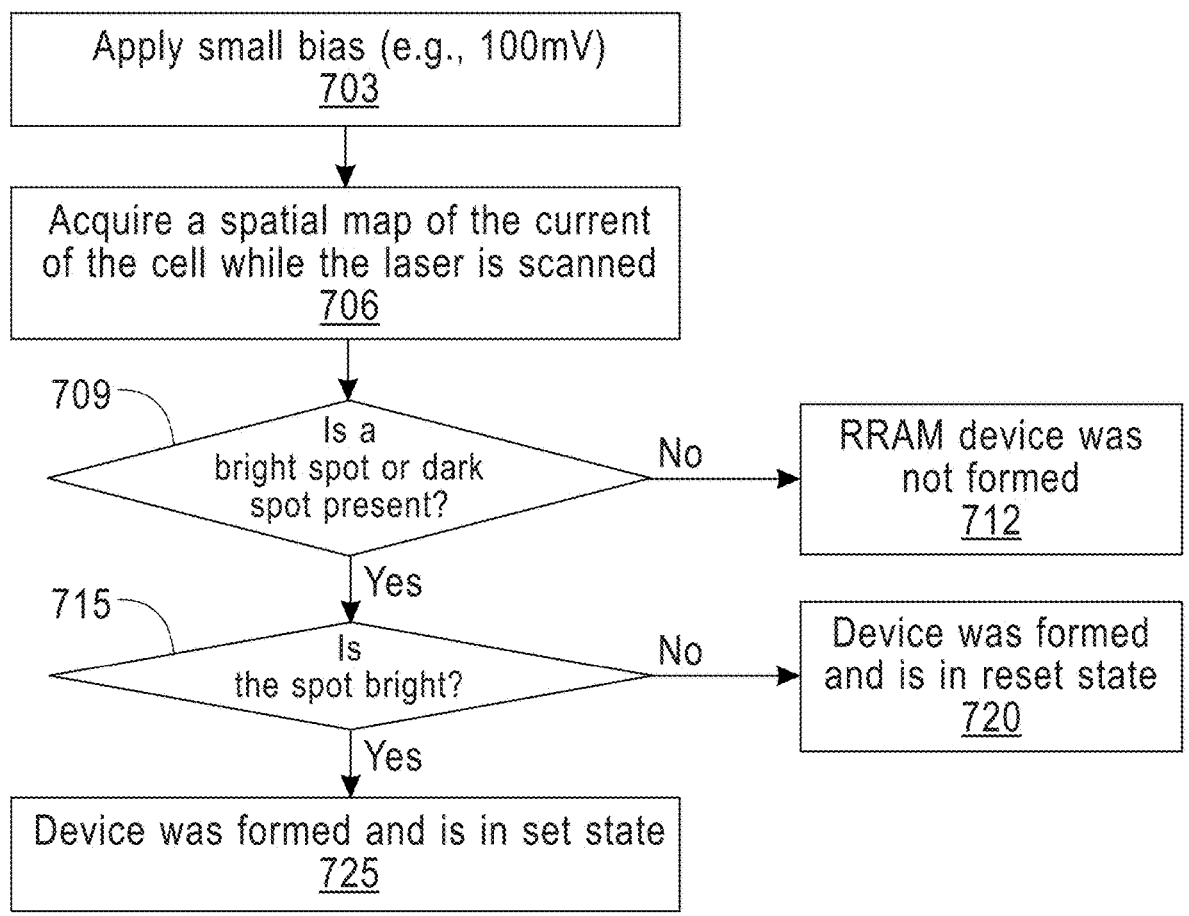
FIG. 10 depicts an exemplary flow diagram depicting a procedure to determine a state of the resistive memory cell: i.e., formed, set, or reset, e.g., using the bright/dark intensity of the measured signal spot.

FIG. 10 depicts an exemplary flow diagram depicting a procedure 700 to determine a state of the resistive memory cell: i.e., formed, set, or reset, e.g., using the bright/dark intensity of the measured signal spot. The method of FIG. 10 can be implemented in a circumstance where it is not necessary to determine the filament location. As shown in FIG. 10, a first step 703 is the application by the voltage bias generator 160 of a bias voltage applied to the cell. After the bias has been applied to the cell, at 706, the current spatial map of the resistive memory cell surface is acquired by scanning the laser and measuring the currents at each location/position. As described herein, the image is then analyzed to look for a spot, e.g., a bright spot or dark spot as shown in the grey scale image of false colors map (FIGS. 6A, 6B). This spot center location can be determined based on determining by computing the centroid of the data represented as a false color image, or alternatively, by fitting a 2D Gaussian or suitable functional shape to the data the obtained current measurements data (e.g., represented as a matrix) to determine the center. Then, at 709, a determination is made as to whether the spot is present or not present. If it is determined that the bright spot or dark spot is not present, it is concluded at 712 that the device was not formed yet, i.e., the forming voltage has not yet been applied to the RRAM device (to set it into an initial LRS). Otherwise, at 709, if it is determined that the bright or dark spot is present, then this indicates that the RRAM cell was formed. The method continues to step 715 to make a determination of whether the image spot is a bright spot or a dark spot. In an embodiment, based upon the gray-scale image color convention used, the system can analyze the color/polarity of the signal. For example, at 715, if the spot is determined as a brighter (white) spot, this can indicate that the device was left in a "reset" state after forming as indicated at 720. Otherwise, at 715, based on the analysis of the color/polarity of the signal, if it is determined that a dark (black) spot image is obtained, this can indicate that the device was left in a "set" state after forming as indicated at 725. In this application, the specific (x, y) position of the filament does not have to be obtained. This methodology would have important application for both failure analysis and security since it may allow to determine the state of a cell. It should also be noted that for some type of materials and cell types, the opposite behavior of the spot may indicate the set/reset state of the cell.

The systems and methods described herein can be implemented to determine the spatial location (e.g., location in a 2-dimensional image plane) of a conductive filament formed in a switching medium of a RRAM device. The systems and methods described herein can be implemented with a practical application to locate the position of the filament during the formation process in a non-invasive and relatively quick approach, allowing measurements of a relatively large number of RRAM devices and to create statistics of the filament formation using relatively large amount of data Further, the systems and methods described herein can utilize optical inspection tools that may be readily available in scientific, diagnostic, and failure analysis laboratories.

Figure 11:
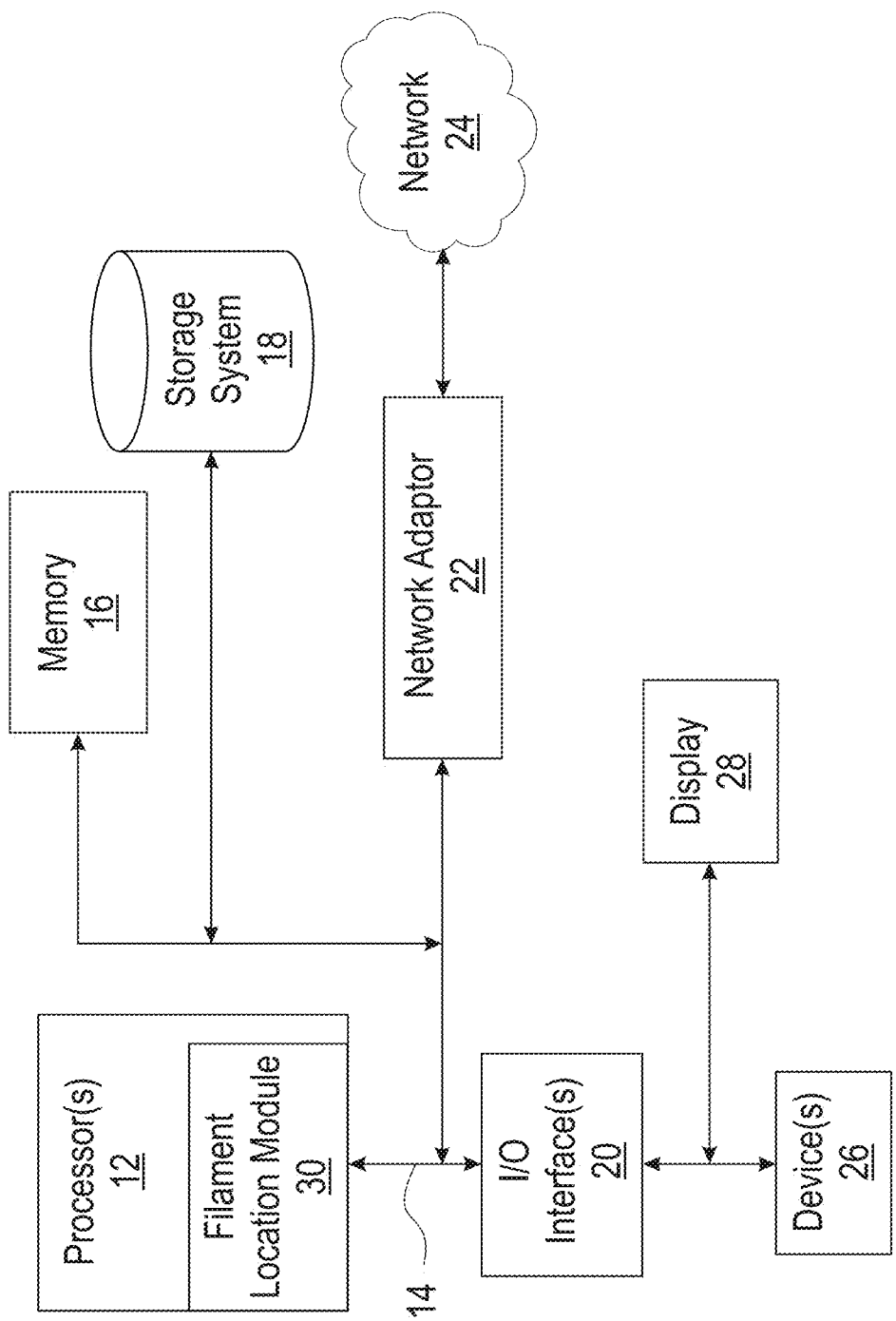
FIG. 11 illustrates a schematic of an example computer or processing system that may implement RRAM filament location based on applied laser signals in one embodiment of the present disclosure.

FIG. 11 illustrates a schematic of an example computer or processing system that may implement RRAM filament location based on applied laser signals in one embodiment of the present disclosure. The computer system is only one example of a suitable processing system and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 7 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, supercomputers, and distributed cloud computing environments that include any of the above systems or devices, and the like.

The computer system may be described in the general context of computer system executable instructions, such as program modules, being executed by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

The components of computer system may include, but are not limited to, one or more processors or processing units 12, a system memory 16, and a bus 14 that couples various system components including system memory 16 to processor 12. The processor 12 may include a module 30 (e.g., filament location module 30) that performs the methods described herein. The module 30 may be programmed into the integrated circuits of the processor 12, or loaded from memory 16, storage device 18, or network 24 or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media may be any available media that is accessible by computer system, and it may include both volatile and non-volatile media, removable and non-removable media.

System memory 16 can include computer system readable media in the form of volatile memory, such as random access memory (RAM) and/or cache memory or others. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces.

Computer system may also communicate with one or more external devices 26 such as a keyboard, a pointing device, a display 28, etc.; one or more devices that enable a user to interact with computer system; and/or any devices (e.g., network card, modem, etc.) that enable computer system to communicate with one or more other computing devices. Such communication can occur via Input/Output (I/O) interfaces 20.

Still yet, computer system can communicate with one or more networks 24 such as a local area network (LAN), a general wide area network (WAN), and/or a public network (e.g., the Internet) via network adapter 22. As depicted, network adapter 22 communicates with the other components of computer system via bus 14. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for determining a spatial location of a filament in a resistive random access memory (RRAM) cell, the method comprising:
    applying a bias signal to the RRAM cell;
    applying a laser signal at different positions of a surface of the RRAM cell;
    measuring a change in a sense signal at the RRAM cell responsive to the applied laser signal at each different surface position;
    creating, using a hardware processor, a map of the sense signal changes corresponding to the different surface positions;
    detecting, using the hardware processor, a presence of a spot in the map at a particular surface position;
    determining an edge or center of the RRAM cell; and
    determining a 2-dimensional coordinate position of the spot compared to the edge/center of the RRAM cell, the spot indicating the location of the filament in the RRAM device.

2. The method as claimed in claim 1, wherein the applying a laser signal at different surface positions comprises using a raster scanning of the laser signal at locations of a surface of the RRAM cell.

3. The method as claimed in claim 1, wherein creating a map of the sense signal changes responsive to the different laser positions comprises:
    creating, using a hardware processor, a color map image depicting resulting measured signal values responsive to each applied laser signal at the different surface positions of the RRAM cell using a coloring scheme.

4. The method as claimed in claim 3, further comprising:
    identifying, within the color map image, a location or position of the spot corresponding to a maximum or minimum signal change.

5. The method as claimed in claim 4, wherein the identifying, within the color map image, of a location or a position of the spot comprises one of:
    computing, using a hardware processor, a centroid of data representing color map image; or
    fitting, using the hardware processor, a 2D Gaussian to the data representing color map image to determine a center of the spot; or
    applying, using the hardware processor, a circular shape having a variable center and radius to the identified spot in the color map image.

6. The method as claimed in claim 4, wherein the determining an edge or center of the RRAM cell comprises:
    measuring an intensity of light reflected from the surface of the RRAM cell based on the applied laser signal at the different positions of the RRAM cell;
    creating a pattern image indicating an amount of reflection; and
    applying edge detector to the pattern image to highlight edges of the RRAM cell.

7. The method as claimed in claim 6, further comprising:
    fitting a geometrical shape to match the highlighted edges of the patterned image of the RRAM cell; and
    determining a size of the geometrical shape; and
    based on the size, determining a center pixel coordinate in the matched geometrical shape in the patterned image.

8. The method as claimed in claim 7, further comprising:
    determining a filament location in an RRAM cell switching medium using:
        the obtained location or position of the spot from the color map image;
        the determined size of the geometrical shape;
        the determined center pixel coordinate in the geometrical shape in the patterned image; and
        a size of the resistive memory device cell.

9. The method as claimed in claim 8, wherein the determining a filament location in an RRAM cell switching medium further comprises:
    computing, using the hardware processor, a 2-dimensional coordinate position (X, Y) according to:

$X=Sm/Sp*(xs-xc)$ and $Y=Sm/Sp*(ys-yc)$ wherein Sm is the size of the resistive memory device cell, Sp is the size of the geometrical shape, (xc, yc) is the determined center pixel coordinate in the geometrical shape, and (xs, ys) is the obtained location or position of the spot from the color map image.

10. The method as claimed in claim 1, wherein an amount of bias applied to the RRAM cell causes at least one of: forming the filament, setting the resistive memory device, or resetting the resistive memory device, said method further comprising one or more of:
    detecting no presence of a spot indicating a non-formed state of the RRAM cell; or
    detecting a spot in the color map image indicating a formed state of the resistive device in a reset state; or
    detecting a spot in the color map indicating a formed state of the resistive device in a set state.

11. The apparatus as claimed in claim 6, wherein an amount of bias applied to the resistive memory device causes at least one of: forming the filament, setting the resistive memory device, or resetting the resistive memory device, said hardware processor further configured to one or more of:
    detect no presence of a spot indicating a non-formed state of the RRAM cell; or
    detect a spot in the color map image indicating a formed state of the resistive device in a reset state; or
    detect a spot in the color map indicating a formed state of the resistive device in a set state.

12. An apparatus for determining a spatial location of a filament in a resistive random access memory (RRAM) cell, the apparatus comprising:
    a signal generator for applying a bias signal to the RRAM cell;

a laser signal generator for applying a laser signal at different positions of a surface of the RRAM cell;

a detector for measuring a change in a signal sensed at the RRAM cell responsive to the applied laser signal at each different surface position;

a memory configured to store a set of instructions;

a hardware processor, in communication with the memory, the set of instructions configuring the hardware processor to:

create a mapping of the measured sense signal changes corresponding to the different surface positions;

detect a presence of a spot in the map corresponding to a sense signal change at a particular surface position;

determine an edge or center of the RRAM cell; and determine a 2-dimensional coordinate position of the spot compared to the edge/center of the RRAM cell, the spot indicating the location of the filament in the RRAM device.

13. The apparatus as claimed in claim 12, further comprising:

a raster scanning system for applying the laser signal at different positions of the surface of the RRAM cell according to a scanning pattern and scan velocity.

14. The apparatus as claimed in claim 12, wherein to create a mapping of the measured signal changes at the different surface positions, the hardware processor is further configured to:

create a color map image depicting resulting measured signal values responsive to each applied laser beam signal at the different surface positions of the RRAM cell using a coloring scheme.

15. The apparatus as claimed in claim 14, wherein the hardware processor is further configured to:

identify, within the color map image, a location or position of the spot corresponding to a maximum or minimum signal change.

16. The apparatus as claimed in claim 15, wherein to determine an edge or center of the RRAM cell, the hardware processor is further configured to:

measure an intensity of light reflected from the surface of the RRAM cell based on the applied laser signal at the different surface positions of the RRAM cell;

create a pattern image indicating an amount of reflection; and apply an edge detector to the pattern image to highlight edges of the RRAM cell.

17. The apparatus as claimed in claim 16, wherein the hardware processor is further configured to:

fit a geometrical shape to match the highlighted edges of the patterned image of the RRAM cell; and determine a size of the geometrical shape; and based on the size, determine a center pixel coordinate in the matched geometrical shape in the patterned image.

18. The apparatus as claimed in claim 17, wherein the hardware processor is further configured to:

determine a filament location in a RRAM cell switching medium using:

the obtained location or position of the spot from the color map image;

the determined size of the geometrical shape;

the determined center pixel coordinate in the geometrical shape in the patterned image; and a size of the resistive memory device cell.

19. The apparatus as claimed in claim 18, wherein to determine a filament location in an RRAM cell switching medium, the hardware processor is further configured to:

compute a 2-dimensional coordinate position (X, Y) according to:

$$X=Sm/Sp*(xs-xc) \text{ and } Y=Sm/Sp*(ys-yc)$$

wherein Sm is the size of the resistive memory device cell, Sp is the size of the geometrical shape, (xc, yc) is the determined center pixel coordinate in the geometrical shape, and (xs, ys) is the obtained location or position of the spot from the color map image.

20. A computer program product for determining a spatial location of a filament in a resistive random access memory (RRAM) cell, the computer program product comprising a computer readable storage medium having program instructions embodied therewith, the program instructions executable by a processor to cause the processor to:

bias the RRAM cell with a bias signal using a bias signal generator;

apply a laser signal at different positions of a surface of the RRAM cell using a laser signal generator;

measure, using a signal detector, a change in a signal sensed at the RRAM cell responsive to the applied laser beam signal at each different surface position;

create a map of the sense signal changes at the different surface positions;

detect a presence of a spot in the map corresponding to a sense signal change at a particular surface position;

determine an edge or center of the RRAM cell; and determine a 2-dimensional coordinate position of the spot compared to the edge/center of the RRAM cell, the spot indicating the location of the filament in the RRAM device.

* * * * *